United States Patent [19]

Swain

[11] 4,425,633

[45] Jan. 10, 1984

[54] VARIABLE DELAY CIRCUIT FOR EMULATING WORD LINE DELAY

[75] Inventor: William J. Swain, McKinney, Tex.

[73] Assignee: Mostek Corporation, Carrollton, Tex.

[21] Appl. No.: 194,334

[22] Filed: Oct. 6, 1980

[51] Int. Cl.³ .......................... G11C 7/00; H03H 7/30
[52] U.S. Cl. .................................... 365/194; 328/56; 333/138; 333/164
[58] Field of Search .................. 365/194, 195, 198; 333/138, 139, 140, 164; 328/56, 167

[56] References Cited

U.S. PATENT DOCUMENTS

| | | | |
|---|---|---|---|
| 3,407,392 | 10/1968 | Ishidate | 365/194 |
| 3,866,061 | 2/1975 | Wen et al. | 365/194 |
| 4,162,540 | 7/1979 | Ando | 365/194 |
| 4,231,110 | 10/1980 | Stinehelfer | 365/194 |

FOREIGN PATENT DOCUMENTS 1193642 6/1970 United Kingdom ................ 365/194

*Primary Examiner*—George G. Stellar

[57] ABSTRACT

A semiconductor memory having an address buffer (10), row decoder (12), word lines (16), bit line (20) and sense amplifier (22) for accessing individual memory cells in an array of memory cells. In order to emulate worst case delays experienced in the word lines in accessing the last cells in the rows in order to prevent the sense amplifiers (22) from reading the bit lines (20) too soon, a tunable delay circuit (30) delays actuation of the sense amplifier. This circuit is divided into a plurality of impedance section with associated parasitic capacitance where groups of sections are bypassed by switching devices such as MOS transistors. The delay of a signal propagating through this tunable delay circuit can be varied by bypassing varying numbers of the sections with the switching devices.

16 Claims, 3 Drawing Figures

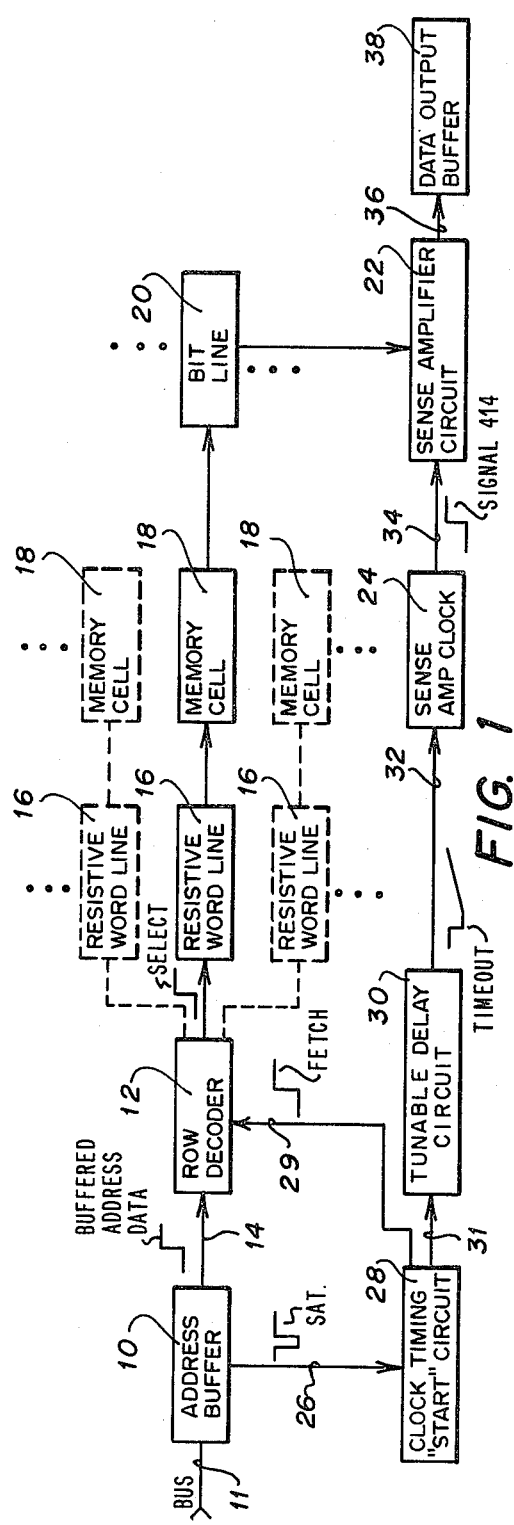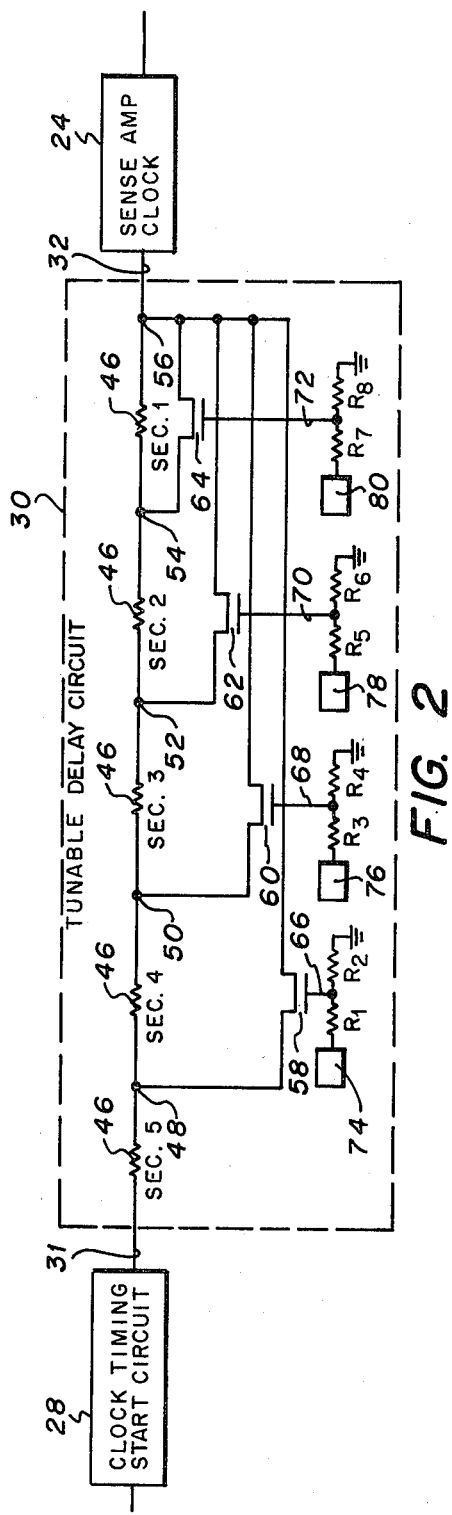

VARIABLE DELAY CIRCUIT FOR EMULATING WORD LINE DELAY

TECHNICAL FIELD

The invention relates to the field of semiconductor memories, and, more particularly, to a circuit for optimizing the emulation of word line delays in semiconductor memories caused by the inherent delay of row decoder stages and the transmission line like effect of distributed resistive word lines. A tunable distributed resistance dummy word line is used to substantially match the delay in propagation along the actual word line.

BACKGROUND ART

Typically, semiconductor state and dynamic type random access memories are arranged with a plurality of individually addressable memory cells arranged in a matrix of rows and columns. The rows are defined by so called word lines which connect individual outputs of a row decoder to the access transistors of all the memory cells in a particular row. These words lines typically are made of doped polysilicon deposited over an insulating layer covering the surface of the semiconductor substrate. Because of the use of polysilicon, the word line acts like a transmission line by virtue of the distributed resistance and the parasitic capacitance between the word line and the substrate. These electrical properties cause delay in the propagation of signals from one end of the word line to the other.

The memory cells of the array are also arranged into columns with all the memory cells of a particular column connected through an access transistor to a bit line. Each bit line is coupled to a sense amplifier which determines what data was stored in the particular memory cell accessed. The sense amplifier must not be enabled prior to the time that valid data is present on its bit line or a misread will occur. Valid data will be present on the bit line connected to the first memory cell in a row before valid data will be present on the bit line coupled to the last memory cell in the row because of the propagation delay experienced by the select signal from the row decoder in getting to the gate of the access transistor of the last memory cell in the row. Because of this delay, all the sense amplifiers must be held back until the maximum delay in accessing the last cell in the row has occurred regardless of which cell was accessed. This is necessary to insure that the data on the bit line coupled to the selected cell will be valid regardless of which cell in the row is accessed.

Thus it was that clock chains using dummy word lines came into existence. To insure that proper data access was made even where the last cell in a row was accessed, a time-out circuit using a distributed resistance polysilicon dummy word line was devised. This time out circuit was used to emulate the actual propagation delay experienced in accessing the last memory cell in the row. The sense amplifiers were then signalled that even if the last memory cell in the row was accessed, the data on the selected bit line was still valid.

This intentionally caused delay must be equal to or greater than the actual propagation delays in the word lines, or the potential for misreads arises. However, since the aforementioned parasitic effects and polysilicon doping levels can change due to processing variations, it is necessary to design for an extra delay in the dummy word line as a margin of safety to account for these processing variations. This extra delay slows down access times however and is undesirable for high speed random access memories.

Presently, computer simulations are used to predict the time delays that will be experienced in the actual word line circuitry. After prototype chips are manufactured, the actual delays experienced can be measured, and the actual time delay which the dummy word line must be designed for can be determined. However, at that point, it is necessary to go back to the polysilicon level of the process, which is about halfway through the process, and change the polysilicon mask dimensions of the dummy word line. This is quite inconvenient.

The invention defined in the claims appended hereto provides a structure and method to decrease access time by optimizing the emulation of propagation delays in the actual word lines without the necessity of making changes to the polysilicon level masks. The invention provides the distinct advantage of a faster chip without the difficulty and expense of polysilicon level mask changes.

DISCLOSURE OF THE INVENTION

In summarizing the broader aspects of the invention, there is provided standard selection circuitry for selecting a memory cell in the array. Other time-out circuitry is coupled to the selection circuitry for emulating the worst case delay in accessing the memory cell as if it were the last cell in the row. The time-out circuitry causes the selected memory cell to be accessed after the time period representing the worst case delay has passed. This time out circuitry is characterized in that it is tunable such that the worst case delay can be substantially matched. Tunability is achieved by dividing the distributed impedance dummy word line into a number of impedance sections which define nodes between them and which form a series electrical path. A number of switching devices, MOS transistors in the preferred embodiment, having high and low impedance states couple the nodes to a common node such that sections of the dummy word can be switched out by providing a low impedance path around a section or sections of the line. These switching devices have control terminals which are coupled to circuitry for controlling whether each switching device is in its high or low impedance state.

BRIEF DESCRIPTION OF THE DRAWINGS

The invention is described in detail below with reference to the drawings of which:

FIG. 1 is block diagram showing the relationship of the functional elements in a semiconductor memory utilizing the invention;

FIG. 2 is a schematic diagram detailing the circuit of the tunable delay circuit;

DETAILED DESCRIPTION OF THE INVENTION

Figure 3:
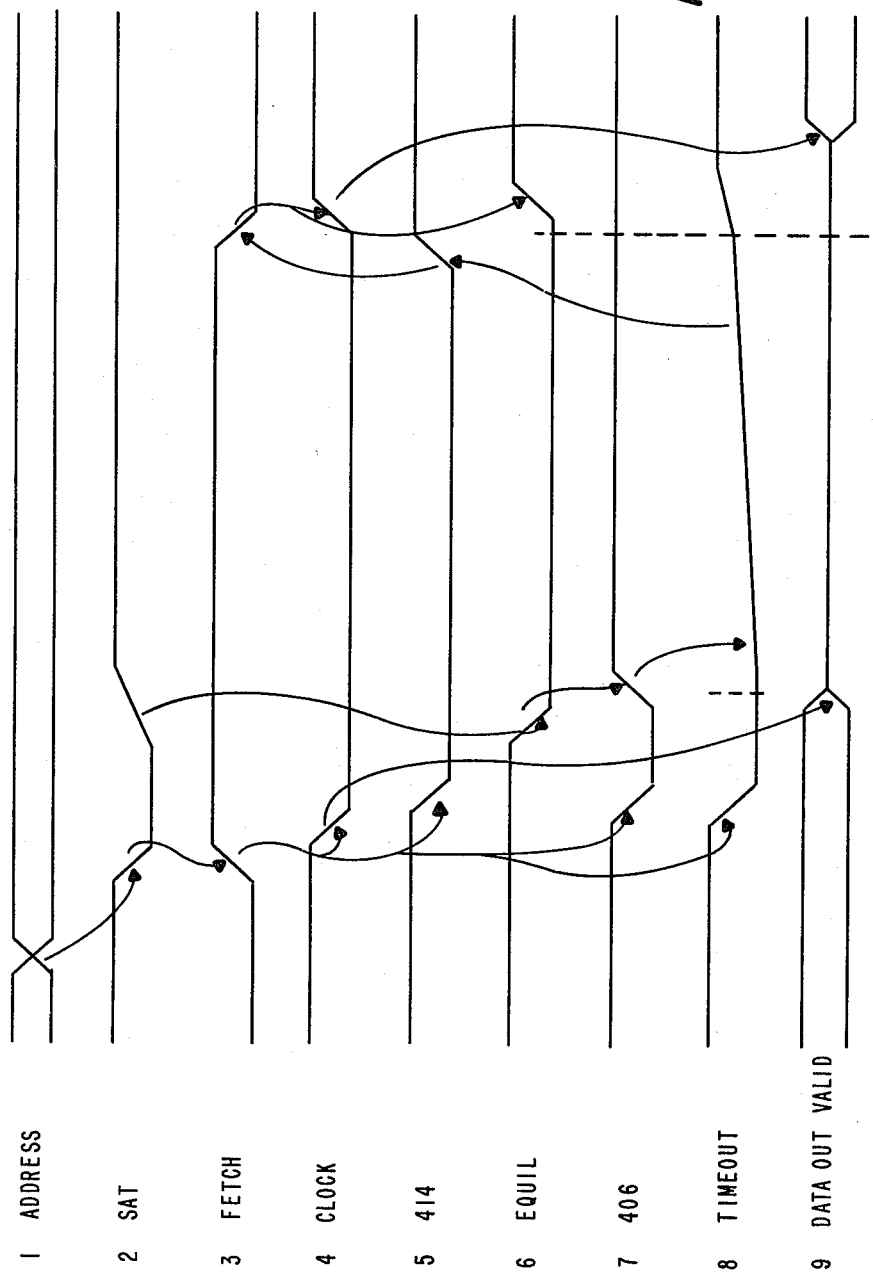
FIG. 3 is a timing diagram showing the relationship of various signals in the system shown in FIG. 1.

Turning now to FIGS. 1 and 3, the operational relationship of the components of the system will be described. Address data indicating the memory cell for which access is desired enters the semiconductor memory on address bus 11. The change in address data is shown generally on line one of FIG. 3.

Address buffer 10 serves to generate a buffered address data signal on bus 14 and a SAT signal on a second output line 26. The buffered address data serves as an input to row decoder 12 indicating the address of the memory cell to be accessed. The SAT signal, as indicated on line two of FIG. 3, is triggered by the change of address data at the input of address buffer 10. It serves to indicate that an access of the semiconductor memory has begun.

Clock timing start circuit 28 receives the SAT signal on line 26 and generates a FETCH signal on output line 29. FETCH is triggered by the downward transition of SAT, as shown on line 3 of FIG. 3, and is transmitted to row decoder 12. FETCH serves to signal row decoder 12 to start the access of the memory cell by decoding the buffered address data on bus 14. When the address data is decoded, row decoder 12 output is coupled to the word line or row of cells containing the desired cell and applies a predetermined electrical signal to that word line. In the preferred embodiment, that electrical signal is such as to turn on the access transistors of all the memory cells connected to that particular word line. The circuitry of standard dynamic and static random access memory cells and the relationship of the access transistors to the word lines and bit lines is well known in the art. Typical arrangements are shown in U.S. Pat. No. 3,967,252 to Donnelly detailing a sense amplifier for a random access memory and showing typical static memory cells in FIG. 1. Typical dynamic random access memory cells are shown in FIG. 1b of U.S. Pat. No. 3,821,717 to McKenny.

Clock timing start circuit 28 also serves to generate a signal 407 on line 31 for signalling the start of a tunable delay period. The signal 407 is substantially identical to the signal 406 illustrated on line seven of FIG. 3. Signal 406 is triggered by the upward transition of FETCH and is an internal signal of clock timing start circuit 28 as will be explained in more detail later. Signal 407 signals the tunable delay circuit 30 that a delay period is started.

Word lines 16 are coupled to the memory cells in their rows through access transistors and each is coupled to an individual output of row decoder 12. When row decoder 12 decodes the address data, it selects one of the word lines at its output and drives it to an electrical state such as to turn on all the access transistors coupled to that word line.

The above noted event causes each memory cell 18 in the row to couple its storage node to bit line 20. Each bit line couples all the memory cells in a column of the array to sense amplifier 22 for that column. Data is stored in the memory cell as one or the other of two states of a bistable "flip-flop". This flip flop has two output nodes one of which is high and the other of which is low at all times. Data is read by connecting the bit line to one of these nodes and a complement bit line to the other. This changes the voltage of the bit line which change indicates whether the data stored in the memory cell was a logical one or zero. This change is detected by sense amplifier 22 which converts the change to a logical one or zero at its output 36.

The word lines 16 are constructed of doped polysilicon which extends across the width of the arrays from the row decoder 12. Doped polysilicon is not a perfect conductor so there is a finite sheet resistance associated with the word lines. In addition, the polysilicon word line is deposited over an insulating layer on the substrate which causes a distributed parasitic capacitance between the word line and the substrate. Thus the SELECT signal from the row decoder output sees a distributed RC type delay circuit in front of it as it propagates down the word line. That is, when the voltage on the row decoder end of the word line is suddenly raised, the parasitic capacitance distributed along the line looks like an initial short and shunts charge off the word lines toward the substrate. This charge charges up the parasitic capacitance thereby causing the voltage on the word line to change gradually from its initial level to the level of the output of row decoder 12. This transmission line effect means that the SELECT signal put out by the row decoder 12 turns on the access transistor of the last memory cell in the selected row later than the access transistor of the first memory cell in the row.

Because the sense amplifier coupled to each bit line does not know whether it is reading the last memory cell in the selected row or the first one, some circuitry is necessary to control the sense amplifier. This circuitry is for the purpose of emulating the delay experienced by the select signal as it propagates down the word line. When a period of time equal to the worst case delay that would be experienced in accessing the last memory call in the selected row has passed, the sense amplifier 22 is signalled that it is permissible to commence sensing the level of the bit line. In the preferred embodiment, this emulation circuitry is tunable such that the access of the memory cell does not occur until the worst case delay that would be experienced in accessing the last memory cell in the selected row has been substantially matched.

The sense amplifier 22 coupled to bit line 20, has an input 34 for receiving a signal 414, illustrated on line 5 in FIG. 3, which indicates that the data on bit line 20 is valid regardless of which column and row has been accessed. The sense amplifier 22 sense what data is in the accessed cell when the signal 414 is received and clocks the sensed data into data output buffer 38 by presenting the data at output 36.

The tunable delay circuit 30 or "dummy word line" is coupled to the output line 31 of the clock timing circuit 28. The tunable delay circuit functions to emulate the delay experienced by the select signal from the output of row decoder 12 as it propagates down the selected word line 16.

Referring to FIG. 3, the timing of the read cycle is as follows. The FETCH signal transition, shown on line 3 of FIG. 3, indicates the beginning of an access of the memory by causing the decoder to select a word line. The upward transition of FETCH triggers: a downward transition in CLOCK, line 4; a downward transition in signal 414, line 5; a downward transition in signal 406, line 7; and a downward transition in TIMEOUT, line 8. The downward transition of CLOCK serves to indicate that the data at the output of data output buffer 38 is no longer valid. The downward transition of signal 414 prevents sense amplifier 22 from sensing the changes on bit line 20. The downward transition in signal 406 is in preparation for the upward transition of 406 which, as noted earlier, signals the start of the delay period of the signal TIMEOUT. When the SAT signal, line 2 of FIG. 3, returns high, the high to low transition of the signal EQUIL, line 6 of FIG. 3, is triggered. EQUIL is the signal which is responsible for balancing out the voltage level on the bit lines.

In the preferred embodiment, the invention is used on a static memory. Each static memory cell is comprised of a bistable circuit having true and complement outputs. A separate bit line is coupled to each of the true and complement outputs through access transistors as shown in FIG. 1 of U.S. Pat. No. 3,967,252 to Donnelly. As explained there, the sense amplifier senses changes in the bit lines by comparing their voltage levels before and after the two access transistors of static memory cell are turned on thereby connecting the bit lines to the true and compliment output storage nodes. As indicated earlier, one of the bit lines will change voltage depending on which storage node is at a logical one level, and which is not. The bit line that changes indicates whether a one or zero has been read.

In order for the comparison to be properly made, the bit lines coupled to the true and complement nodes have to be at exactly the same voltage level before the access transistors are turned on. This is the function of the EQUIL signal. When it is in its high state, the bit lines are being equilibrated to the same voltage level. When EQUIL makes its high to low transition, the bit lines have reached the same voltage level and the read cycle can begin.

It is the high to low transition of the EQUIL signal which triggers the low to high transition of signal 406 shown on line 7 of FIG. 3. This transition of signal 406 indicates the initiation of the tunable delay period. When signal 406 makes its low to high transition inside clock timing start circuit 28 in FIG. 1, another signal on line 31, a signal 407 not shown in FIG. 3, also makes a low to high transition which is applied to the input of tunable delay circuit 30.

At the moment the input of tunable delay circuit 30 is driven high, the parasitic capacitances coupling the polysilicon line of the tunable delay circuit to the substrate begin to charge up. The output signal from the tunable delay circuit 30 is the signal TIMEOUT on line 32 illustrated on line 8 of FIG. 3. As the parasitic capacitances charge up, the voltage on line 32 begins to rise. When it reaches a predetermined point, sense amp clock 24 coupled to line 32 is triggered and generates a low to high transition in signal 414, line 5 of FIG. 3. This transition of signal 414 is transmitted via line 34 to sense amplifier circuit 22 and signals it that it is safe to read the accessed data and clock it into data output buffer 38 via line 36.

The low to high transition of signal 414 also triggers the high to low transition of the signal FETCH which tells row decoder 12 that the access has been completed and that it can lower the selected word line back to its de-selected level.

This high to low transition of FETCH triggers the low to high transition of the CLOCK signal which causes two things to happen. First, it makes the data available at the output of the data output buffer, and second it causes a low to high transition in the EQUIL signal which causes the true and complement bit lines for each column to be equilibrated to the same voltage level in preparation for the next access.

The length of the delay during the rise of the TIMEOUT signal can be varied in accordance with the principles of the present invention by effectively varying the electrical characteristics of the doped polysilicon line of the tunable delay circuit. This is accomplished, referring to FIG. 2, by dividing the distributed impedance of the tunable delay circuit into a number of impedance sections 46 such that the individual sections of the polysilicon line are connected together to define a series electrical path from line 31 in FIG. 1 to line 32. The intersection of the impedance sections defines a plurality of nodes 48, 50, 52, 54 and 56.

Each of these individual nodes is coupled to a common node 56 by a switching device having two switching terminals and high and low impedance states between these terminals. A control terminal for each switching device controls whether that device is in its high or low impedance state.

In the preferred embodiment, node 48 is coupled to common node 56 by MOS transistor 58 having its drain coupled to node 48 and its source coupled to common node 56. MOS transistor 60 has its drain coupled to node 50 and its source to node 56. MOS transistor 62 has its drain coupled to node 52 and its source to node 56. MOS transistor 64 has its drain coupled to node 54 and its source coupled to node 56. Thus MOS transistor 64 bypasses section 1 and MOS transistor 62 bypasses sections 1 and 2. Likewise, MOS transistor 60 bypasses sections 1, 2 and 3, and MOS transistor 58 bypasses sections 1, 2, 3 and 4.

Each switching device has a control terminal for controlling whether the device in its high or low impedance state. Each control terminal is coupled to a circuit which controls the switching device's impedance state. In the preferred embodiment, the control terminals are the gates 66, 68, 70 and 72 of the MOS transistors 58, 60, 62 and 64. Each gate is coupled to a resistive voltage divider which controls whether the MOS transistor connected to it is in a high or low impedance state.

In the preferred embodiment of the invention, gate 66 is coupled to the resistive voltage divider comprised of R1 and R2. The first resistor R1 has its first terminal coupled to a first voltage source represented by a metal pad 74. The second terminal of R1 is coupled to gate 66 and the first terminal of second resistor R2. The remaining terminal of R2 is coupled to ground or some second voltage potential. A similar arrangement is coupled to gates 68, 70 and 72 of MOS transistors 60, 62 and 64 respectively. The characteristics of the first and second voltage sources are, in the preferred embodiment, selected such that a predetermined one of the switching devices is in the low impedance state at all times.

The device that is selected to be in the low impedance state at all times is determined experimentally, and is kept in the low impedance state by constructing the semiconductor memory so that the metal pad (74 or 76 or 78 or 80) that is coupled to the resistive voltage divider coupled to the gate of the selected transistor is permanently coupled to a voltage source that keeps the selected transistor in its low impedance state. All the other pads are left floating or are connected to voltage sources having characteristics designed to insure the other non-selected transistors are in the high impedance state.

The method for selecting which transistor to maintain in the low impedance state is as follows. The objective is to optimize emulation of the word line delay by tuning the tunable delay circuit 30 so as to impose a delay equal to or slightly greater than the worst case delay which would be experienced in accessing the last memory cell in a row.

First, a predetermined data pattern is stored in the memory and the last cells in the array rows i.e, farthest from row decoder 12, are accessed because they experience the longest delays. Simultaneously with the access of the last cells, one of the switching devices is placed in its low impedance state by applying a voltage to the pad of its voltage divider sufficient to turn on the selected transistor. The data output of the memory is then checked to insure correct access has occurred. If it has, another switching device is selected and caused to assume its low impedance state while all the other switching devices are in a high impedance state. Again the data output is tested for correctness. If it is correct, the above two steps are repeated until a switching device is found that causes failure, the switching device which bypasses the next fewer number of sections is selected and adapted, as described above, to remain permanently in the low impedance state when the memory is operating.

Although the invention has been described in terms of a single preferred embodiment, it will be appreciated by those skilled in the art that many equivalent embodiments can be devised. These variants are intended to be included within the scope of the claims appended hereto.

What is claimed is:

1. A variable delay circuit for optimizing emulation of word line delays in semiconductor memories having a distributed resistive delay line comprised of:
    a plurality of nodes interspersed along the length of said distributed resistive delay line and defining a plurality of individual sections of the delay line, and wherein the resistance from each node to a common node at the end of the delay line is a fraction of the total resistance of the entire line;
    a plurality of switching devices with each switching device connected between one of said nodes and common node for bypassing a preselected section or group of sections of the distributed resistive delay time.

2. A variable delay circuit as claimed in claim 1 wherein the switching devices are MOS transistors having source and drain terminals connecting one of the nodes to common node and having gate terminals for controlling whether a high or low impedance appears between the source and drain terminals.

3. A variable delay circuit as claimed in claim 2 wherein the gate of each MOS transistor is connected to a resistive voltage divider having two ends and a middle node, said voltage divider having one end connected to a first voltage source and the other end adapted to be connected to a potential sufficient to turn on the MOS transistor connected to the middle node of the voltage divider causing it to have a low impedance between its source and drain nodes.

4. A variable delay circuit as claimed in claim 2 wherein a preselected one of said MOS transistors is connected so as to always be turned on whenever the semiconductor memory is operating.

5. A tunable delay circuit for use in creating adjustable delays in integrated circuits comprised of:
    a distributed resistance means having capacitance associated therewith for simulating the delay effects found in propagation of signals down delay lines said distributed resistance means being subdivided into a plurality of sections thereby defining nodes between subsections and nodes at either end of said distributed resistance means;
    a plurality of switching means having switching terminals, each said switching means having its switching terminals coupling one of said plurality of nodes to a common node at one end of said distributed resistance means where each said switching means has a high impedance state and a low impedance state and each said switching means has a control terminal for controlling the state of each said switching means;
    a means for coupling to each said control terminal for controlling whether each said switching device is in a high or low impedance state.

6. A variable delay circuit for optimizing emulation of word line delays in semiconductor memories having distributed resistance word lines, sense amplifiers, and address decoding means comprised of:
    a distributed impedance means divided into a plurality of impedance sections and having all said sections connected together to form a series elecrical path through said distributed impedance where the intersections of said impedance sections define a plurality of nodes, said distributed impedance means being coupled between said address decoding means and said sense amplifiers to delay a signal from said address decoding means indicating that an access to said semiconductor memory has commenced and to apply said signal to said sense amplifier after said delay to enable said sense amplifier to sense the data accessed from the selected address:
    a plurality of switching means each coupled between one of said plurality of nodes and a common node at one end of said series electrical path where each said switching means has a high impedance state and a low impedance state and each said switching means has a control terminal for controlling the state of each said switching means;
    a means for coupling to each said control terminal for controlling whether each said switching device is in a high or low impedance state.

7. A semiconductor memory as defined in claim 6 wherein said distributed impedance means is comprised of a doped polycrystalline semiconductive material deposited over an insulating material on a monocrystalline substrate.

8. A semiconductor memory as defined in claim 6 or 7 wherein each said switching means is an MOS transistor having its drain and source coupled between one of said plurality of nodes to said common node, and having its gate terminal as said control terminal.

9. A semiconductor memory as defined in claim 8 further comprising a plurality of resistive voltage divides each comprised of a first resistor having its first terminal for coupling to a first voltage source and its second terminals coupled to one of said control terminals and a second resistor having a first terminal coupled to said control terminal that said second terminal of said first resistor is coupled to, and said second resistor having a second terminal for coupling to a second voltage source.

10. A semiconductor memory as defined in claim 7 wherein the characteristics of said first and second voltage sources are selected such that only a predetermined one of said switching means is in said low impedance state at any particular time.

11. A method for optimizing emulating of word line delays in semiconductor memories characterized in:
    dividing a distributed resistive delay circuit into a plurality of sections each section defining a node;
    bypassing combinations of one or more sections with switching devices capable of assuming high and low impedance states between their switching terminals;
    storing a predetermined data pattern in the memory;
    accessing the memory cells in the semiconductor memory experiencing the longest delays in access time while simultaneously placing one of the switching devices in a low impedance state;

testing the output from the semiconductor memory to determine if a correct access has been made;

if a correct access has been made, selecting another switching device bypassing one or more additional sections than the last switching device selected and causing it to assume a low impedance state while all the other switching devices are in a high impedance state;

testing the output of the semiconductor to determine if a correct access has been made;

repeating the next above two steps until the switching device is found which causes the semiconductor memory to fail to function correctly;

selecting the existing switching device that bypasses the next fewer number of sections of the distributed resistance delay circuit than the switching device that caused failure;

adapting the switching device selected in the step next above to remain permanently in the low impedance state when the semiconductor memory is operating.

12. An integrated circuit semiconductor memory that can be tuned to eliminate extra access time caused by internal access delays comprised of:

an address buffer means (10) for receiving address data on address bus (11) and for generating buffered address data at a first output (14) and for generating a SAT signal at a second output (26) for indicating that an access of said semiconductor memory has begun;

a clock timing means (28) coupled to said second output (26) for receiving said SAT signal and generating a FETCH signal at a first output (29) after receiving SAT, said FETCH signal for starting internal access by said semiconductor memory of the memory cell having the address represented by said buffered address data, and for generating a TIMEOUT signal at a second output (31) for signalling the start of a tunable delay period;

a row decoder means (12) coupled to said first output (14) of said address buffer means (10) to received said buffered address data and coupled to said first output of said clock timing means (28) for receiving said FETCH signal for decoding said buffered address data upon receipt of said FETCH signal and for selecting one of a plurality of output lines and causing it to assume a predetermined electrical state;

a plurality of memory cell means arranged in an array of rows and columns for storing data;

a plurality of distributed resistance word line means (16) coupled to said plurality of output lines from said row decoder means (12), each said word line coupled to a row of said memory cell means including the memory cells in the row connected to said selected word line to be available for access;

a plurality of bit lines (20) each bit line coupled to all the memory cells in a column of said array for coupling to the storage nodes of said memory cell in the row of each column which is selected by said row decoder means (12);

a plurality of sense amplifier means (22) coupled to said bit lines (20) and having an input (34) for receiving a signal indicating that the data on said bit lines (20) is valid regardless of which column and row has been accessed, said sense amplifier means (22) for sensing what data was stored in said accessed memory cell and so indicating and having an output (36);

a tunable delay means (30) coupled to said second output (31) of said clock timing means (28) and having an output (32) for emulating the delay in propagation of the select signal on said word line means (16) by delaying the propagation of said TIMEOUT circuit through said delay means (30) to said output (32) by a tunable amount, said tunable delay means being responsive to electrical signals to thereby provide tunable delay times;

a sense amp clock means (24) coupled to said output (32) of said tunable delay means (30) and to said input (34) of said sense amplifier means (22) for sensing when said TIMEOUT signal has reached a predetermined level at said output (32) and for signalling said sense amplifier means (22) to read the accessed data and to present the data so read at an output (36);

a distributed impedance means divided into a plurality of impedance sections and having all said sections connected together to form a series electrical path from said second output (31) of said clock timing means (28) to said output (32) with the intersection of said impedance sections defining a plurality of nodes;

a plurality of switching means each coupled between one of said plurality of nodes and a common node at one end of said series electrical path where each said switching means has a high impedance state and a low impedance state and each said switching means has a control terminal for controlling the state of each said switching means; and a means for coupling to each said control terminal for controlling whether each said switching device is in a high or a low impedance state.

13. A semiconductor memory as defined in claim 12 wherein said distributed impedance means is comprised of a doped polycrystalline semiconductive material deposited over an insulating material on a monocrystalline substrate.

14. A semiconductor memory as defined in claim 12 or 13 wherein each said switching means is an MOS transistor having its drain and source coupled between one of said plurality of nodes, and having its gate terminal as said control terminal.

15. A semiconductor memory as defined in claim 14 further comprising a plurality of resistive voltage dividers each comprised of a first resistor having its first terminal for coupling to a first voltage source and its second terminal coupled to one of said control terminals and a second resistor having a first terminal coupled to said control terminal that said second terminal of said first resistor is coupled to, and said second resistor having a second terminal for coupling to a second voltage source.

16. A semiconductor memory as defined in claim 5 wherein the characteristics of said first and second voltage sources are selected such that only a predetermined one of said switching means is in said low impedance state at any particular time.

* * * * *